(12) United States Patent
Cho et al.

(10) Patent No.: US 8,557,664 B2
(45) Date of Patent: Oct. 15, 2013

(54) METHODS OF FABRICATING SEMICONDUCTOR DEVICES

(71) Applicant: Samsung Electronics Co., Ltd., Gyeonggi-do (KR)

(72) Inventors: Kwan-sik Cho, Hwaseong-si (KR); Kwang-youl Chun, Seoul (KR); Jae-man Yoon, Gyeonggi-do (KR); Bong-soo Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/644,166

(22) Filed: Oct. 3, 2012

(65) Prior Publication Data

US 2013/0026564 A1    Jan. 31, 2013

Related U.S. Application Data

(63) Continuation of application No. 13/008,242, filed on Jan. 8, 2011, now Pat. No. 8,293,603.

(30) Foreign Application Priority Data

Mar. 2, 2010   (KR) .................. 10-2010-0018568

(51) Int. Cl.
*H01L 21/336* (2006.01)

(52) U.S. Cl.
USPC 438/270; 438/675; 257/E21.41; 257/E21.585

(58) Field of Classification Search
USPC .............. 438/270, 675; 257/E21.41, E21.585
See application file for complete search history.

(56) References Cited

U.S. PATENT DOCUMENTS

2009/0097315 A1 * 4/2009 Yun et al. ................. 365/185.13
2011/0003459 A1 * 1/2011 Shin et al. ..................... 438/430

\* cited by examiner

*Primary Examiner* — Alexander Ghyka
*Assistant Examiner* — Stanetta Isaac
(74) *Attorney, Agent, or Firm* — Myers Bigel Sibley & Sajovec, P.A.

(57) ABSTRACT

A method of fabricating a semiconductor device using a recess channel array is disclosed. A substrate is provided having a first region and a second region, including a first transistor in the first region including a first gate electrode partially filling a trench, and source and drain regions that are formed at both sides of the trench, and covered by a first insulating layer. A first conductive layer is formed on the substrate. A contact hole through which the drain region is exposed is formed by patterning the first conductive layer and the first insulating layer. A contact plug is formed that fills the contact hole. A bit line is formed that is electrically connected to the drain region through the contact plug, and simultaneously a second gate electrode is formed in the second region by patterning the first conductive layer.

11 Claims, 14 Drawing Sheets

METHODS OF FABRICATING SEMICONDUCTOR DEVICES

CROSS-REFERENCE TO RELATED APPLICATIONS

This application is a continuation application of U.S. patent application Ser. No. 13/008,242 filed Jan. 8, 2011 which claims priority under 35 U.S.C. §119 from Korean Patent Application No. 10-2010-0018568, filed on Mar. 2, 2010, in the Korean Intellectual Property Office, the disclosures of which are incorporated herein in their entireties by reference.

BACKGROUND

The inventive concept relates to semiconductor devices and methods of fabricating semiconductor devices, and more particularly, to methods of fabricating a semiconductor device including a gate electrode filling a trench.

When the channel length of a semiconductor devices, such as a dynamic random access memory (DRAM), is reduced, it is difficult to prevent short channel effects and source/drain punch-through. In addition, an amount of leakage current may be increased, which may reduce the refresh time of a DRAM. To address these problems, recess channel array transistors have been introduced. When a recess channel array transistor is used in a DRAM, cell bit lines and gate electrodes of a peripheral circuit are formed simultaneously. Errors may occur in semiconductor devices due to a step difference between a region where bit-line contact plugs are formed and a region where bit-line contact plugs are not formed.

SUMMARY

Embodiments of the inventive concept may provide semiconductor devices that are more reliable and may have improved performance by using recess channel array transistors.

Embodiments of the inventive concept may also provide methods of fabricating semiconductor devices that may be more reliable and may have improved performance by using a recess channel array transistor.

According to some embodiments of the inventive concept, there is provided a semiconductor device including a substrate having a first region and a second region, wherein a trench is formed in the first region. A first gate electrode partially fills the trench, and source and drain regions are formed in the semiconductor substrate at both sides of the trench. A bit line extends to cross a upper portion of the drain region on the semiconductor substrate and has a contact hole corresponding to the drain region. A contact plug fills the contact hole, and a second gate electrode is formed in the second region of the semiconductor substrate and is formed of the same material as the bit line.

According to further embodiments of the inventive concept, there is provided a semiconductor device including a semiconductor substrate including a first transistor including a first gate electrode that partially fills a trench, source and drain regions formed at both sides of the trench, and a second transistor including a second gate electrode at an upper portion of the semiconductor substrate. A bit line extends to cross an upper portion of the drain region of the first transistor of the semiconductor substrate and has a contact hole corresponding to the drain region, and a contact plug partially fills the contact hole and electrically connects the drain region and the bit line. In addition, the second gate electrode of the second transistor is formed of the same material as the bit line, and is formed of a different material from the bit line.

According to further embodiments of the inventive concept, there is provided a method of fabricating a semiconductor device. A substrate is provided having a first region and a second region, including a first transistor in the first region including a first gate electrode partially filling a trench and source and drain regions that are formed at both sides of the trench, and is covered by a first insulating layer. A first conductive layer is formed on the substrate. A contact hole through which the drain region is exposed is formed by patterning the first conductive layer and the first insulating layer. A contact plug that partially fills the contact hole is formed. A bit line that is electrically connected to the drain region through the contact plug is formed, and simultaneously a second gate electrode in the second region is formed by patterning the first conductive layer.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
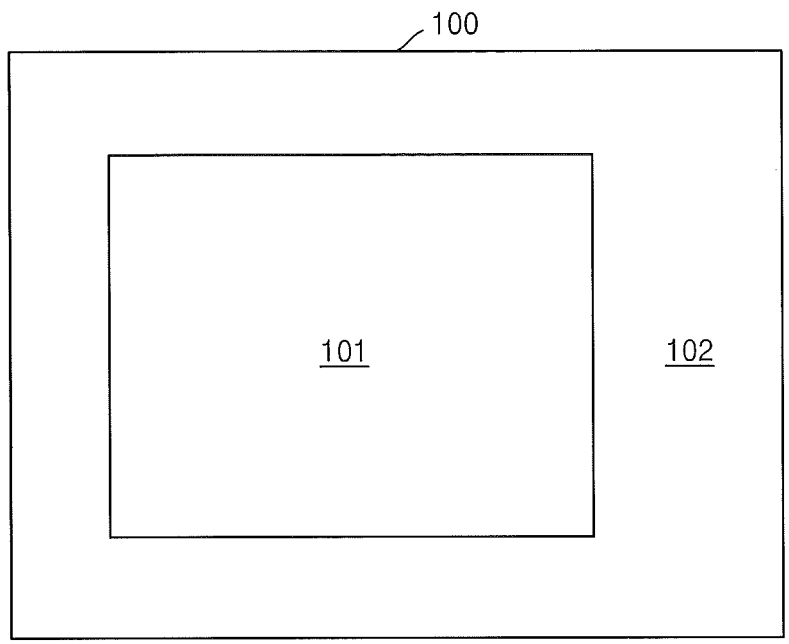
FIG. 1 is a plan view of a semiconductor device, according to some embodiments of the inventive concept.

Hereinafter, the inventive concept will be described in detail by explaining exemplary embodiments of thereof with reference to the attached drawings.

Reference will now be made in detail to example embodiments. However, the inventive concept is not limited to the embodiments described hereinafter, and the embodiments herein are rather introduced to provide easy and complete understanding of the scope and spirit of the inventive concept.

It will be understood that when a layer is referred to as being "on," another layer, it may be directly on the other layer or intervening layers may be present. In the drawings, the thicknesses of layers and regions are exaggerated for clarity. Like reference numerals in the drawings denote like elements, and thus their description will be omitted. As used herein, the term "and/or" includes any and all combinations of one or more of the associated listed items.

The terminology used herein is for the purpose of describing particular embodiments only and is not intended to be limiting of the inventive concept. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Reference will now be made in detail to example embodiments, examples of which are illustrated in the accompanying drawings. With regard to the drawings, it will be understood that various changes in form and details may be made according to fabricating technologies and/or tolerance. Thus, embodiments of the inventive concept are not limited to particular forms illustrated in the drawings, and for example, should include various changes in forms, which may be caused during fabrication.

FIG. 1 is a plan view of a semiconductor device 100 according to some embodiments of the inventive concept.

Referring to FIG. 1, the semiconductor device 100 includes a cell region 101 and a peripheral region 102. A semiconductor memory cell array such as volatile memory (e.g., a dynamic random access memory (DRAM)) cell array and a non-volatile memory (e.g., a flash memory) cell array may be formed in the cell region 101. Peripheral circuits that are electrically connected to the cell arrays may be formed in the peripheral region 102. In FIG. 1, the cell region 101 is a central portion of the semiconductor device 100, and the peripheral region 102 surrounds the cell region 101, but the inventive concept is not limited to this arrangement. That is, the cell region 101 and the peripheral region 102 may be disposed in various arrangements. According to another embodiment of the inventive concept, the peripheral region 102 may be disposed within the cell region 101. For convenience of description, the terminologies of the cell region 101 and the peripheral region 102 are used. However, the cell region 101 and the peripheral region 102 may also be referred to as a first region and a second region, as recited in the accompanying claims. In addition, although the terminology of the peripheral region 102 is used in FIG. 1, the peripheral region 102 includes a region where the cell arrays are not formed, such as a core region. Transistors of the cell arrays formed in the cell region 101 may each be a recess channel array transistor. Transistors formed in the peripheral region 102 may each be a transistor including a gate insulating layer formed on a semiconductor substrate and a gate electrode that is formed on the gate insulating layer.

Figure 2:
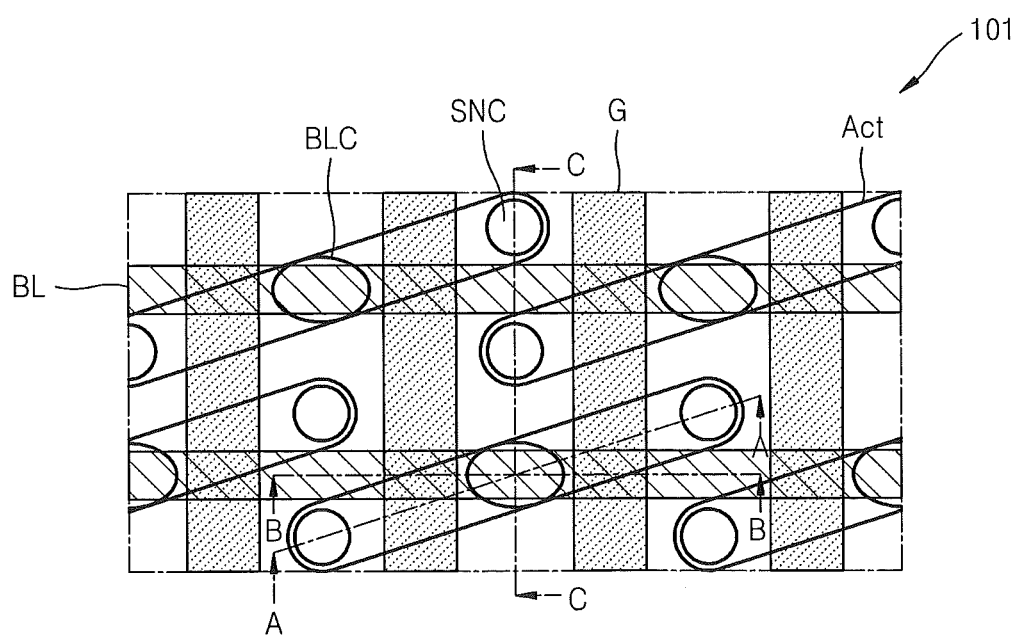
FIG. 2 is a schematic plan view of a cell region of the semiconductor device of FIG. 1.

FIG. 2 is a schematic plan view of the cell region 101 of the semiconductor device 100 of FIG. 1.

Referring to FIG. 2, a plurality of active regions Act, a plurality of gate lines G and a plurality of bit lines BL are disposed in the cell region 101. Portions of the active regions Act, where the gate lines G are not formed, may be source and drain regions. A storage node contact SNC for electrically connecting a capacitor (not shown) and the source regions to each other may be formed on the source regions. In addition, a bit-line contact plug BLC for electrically connecting the drain regions and the bit lines BL to each other may be formed on the drain regions.

The active regions Act may be defined by a device isolation layer (not shown). As shown in FIG. 2, the active regions Act may extend with respect to extension directions of the bit lines BL and the gate lines G at a predetermined angle.

The gate lines G may be disposed to cross the active regions Act. In the present embodiment shown in FIG. 2, a single active region Act crosses two gate lines G. According to another embodiment of the present invention, a predetermined appropriate number of gate lines G may cross a single active region Act. As described above, the source and drain regions may be disposed in the active regions Act disposed at both sides of the gate lines G. In the present embodiment, the drain region may be disposed between two gate lines G that cross a single active region Act, and two source regions may be disposed outside of the two gate lines G. The source and drain regions may be formed by doping with impurities or ion injection, and may be oppositely referred according to a circuit configuration of a target transistor.

The bit-line contact plug BLC may be formed on the drain regions, and may electrically connect the drain regions to the bit lines BL. The bit-line contact plug BLC should be electrically separated from the gate lines G adjacent thereto. In the present embodiment, a single bit-line contact plug BLC formed in a single active region Act may be shared by transistors in the single active region Act adjacent to the bit-line contact plug BLC.

The bit lines BL may be electrically connected to the bit-line contact plugs BLC. In FIG. 2, the bit lines BL are materially perpendicular to the gate lines G. In another embodiment, the bit lines BL and the gate lines G may extend at a predetermined appropriate angle.

Storage node contacts SNC may be formed on the source regions. As described above, the source regions may be electrically connected to storage regions (not shown), for example, capacitors through the storage node contacts SNC. The storage node contacts SNC should be electrically separated from the bit lines BL adjacent thereto.

As shown in FIG. 2, two transistors may be formed in a single active region Act.

Figure 3:
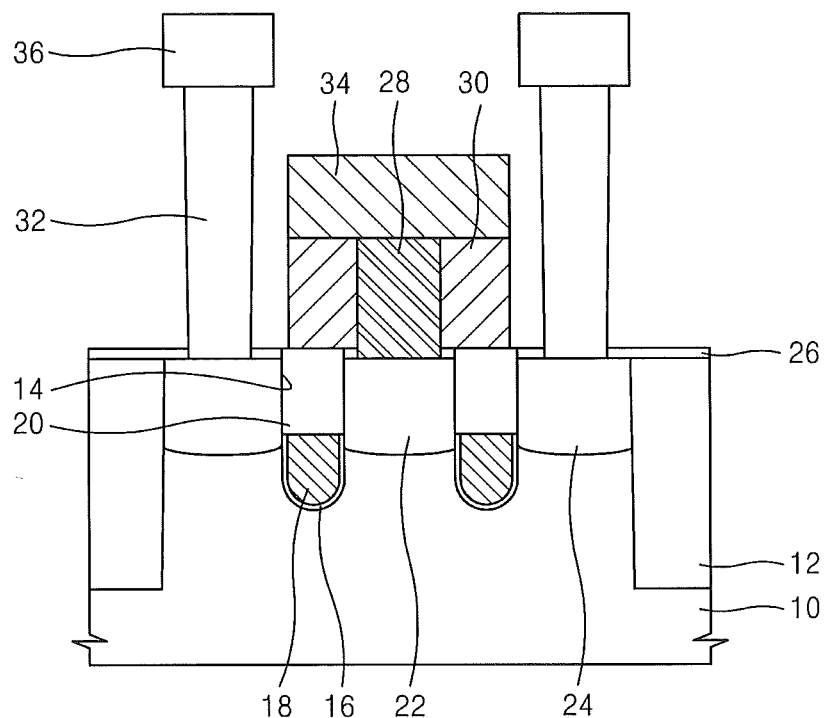
FIG. 3 is a schematic cross-sectional view of the cell region taken along a line A-A of FIG. 2.

FIG. 3 is a schematic cross-sectional view of the cell region 101 taken along a line A-A of FIG. 2.

Referring to FIGS. 2 and 3, a device isolation layer 12 for defining the active regions Act is provided in a semiconductor substrate 10. As shown in FIG. 3, two transistors may be provided in the active region Act. That is, two gate electrodes 18, a single drain region 22, and two source regions 24 may be provided in the active region Act.

Trenches 14 may extend downwards from an upper surface of the semiconductor substrate 10. Gate insulating layers 16 may be provided on lower portions of inner walls of the trenches 14. Gate electrodes 18 may be provided on the gate insulating layers 16 at the lower portions of the inner walls of the trenches 14. Capping layers 20 may be provided on the gate electrodes 18 in the trenches 14. The drain region 22 may be formed between the trenches 14. The source regions 24 may be formed outside of the trenches 14. The drain region 22, and the source regions 24 may be formed in such a manner that their lower surfaces are located more deeply in the semiconductor substrate 10 than upper surfaces of the gate electrodes 18.

When a voltage is applied to the gate electrodes 18, a channel region may be formed along the semiconductor substrate 10 outside of the trenches 14. A first insulating layer 26 may be formed on the semiconductor substrate 10 and the device isolation layer 12. Contact holes through which portions of the drain region 22 and the source regions 24 are exposed may be formed in the first insulating layer 26. As shown in FIGS. 2 and 3, a bit line BL 30 may cross an upper portion of the drain region 22. The bit line BL 30 may have a contact hole corresponding to the contact hole through which the drain region 22 is exposed, from among the contact holes formed in the first insulating layer 26.

A bit-line contact plug BLC 28 for filling the contact hole of the first insulating layer 26 and the contact hole of the bit line BL 30 may be provided on the exposed drain region 22. The bit line BL 30 may be electrically connected to the drain region 22 through the bit-line contact plug BLC 28. Upper surfaces of the bit line BL 30 and the bit-line contact plug BLC 28 may be flush with each other to not have a step difference. An upper bit line 34 may be provided on the upper surfaces of the bit lines BL 30 and the bit-line contact plug BLC 28. Storage node contacts SNC 32 that are electrically connected to the source regions 24 through the contact holes exposing the source regions 24 of the first insulating layer 26 therethrough may each be provided on the source regions 24. Storage regions 36, for example, capacitors may be provided on the storage node contacts SNC 32.

FIG. 3 illustrates the two transistors; however the inventive concept is not limited thereto, and in other embodiments, another number of transistors may be formed in a single active region. In addition, for convenience of description, in FIGS. 3 and 4 through 17, DRAM cell transistors and transistors formed in the peripheral region will be described. However, the inventive concept may also use transistors for performing other functions, in particular recess channel array transistors.

Hereinafter, a method of fabricating the semiconductor device 100 of FIGS. 2 and 3 will be described.

FIGS. 4 through 17 are cross-sectional views for explaining a method of fabricating the semiconductor device, according to some embodiments of the inventive concept. That is, FIGS. 4 through 17 are cross-sectional views of the semiconductor device taken along a line B-B of FIG. 2 and a line C-C of FIG. 2, and are cross-sectional views of transistors formed on the peripheral region, which are illustrated according to a fabricating order.

Figure 4:
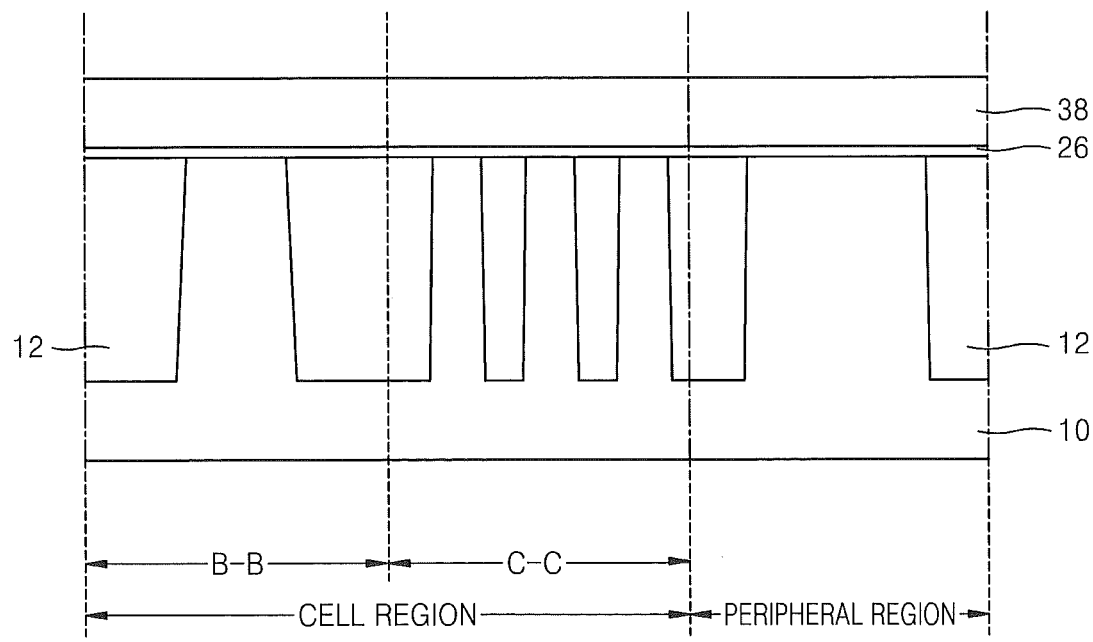
FIGS. 4 through 17 are cross-sectional views for explaining methods of fabricating a semiconductor device, according to some embodiments of the inventive concept, and are cross-sectional views of the semiconductor device taken along a line B-B of FIG. 2 and a line C-C of FIG. 2, and are cross-sectional views of transistors formed on the peripheral region.

Referring to FIG. 4, in a cell region and a peripheral region, the device isolation layer 12 for defining the active region Act of the semiconductor substrate 10 is formed. The semiconductor substrate 10 may include a substrate including a semiconductor such as silicon or silicon-germanium, an epitaxial layer, silicon on insulator (SOI) layer, or a semiconductor on insulator (SeOI) layer. The device isolation layer 12 may be a shallow trench isolation (STI) region for increasing the speed and integrity of a semiconductor device, and may include at least one of, for example, silicon oxide, silicon nitride, and silicon oxynitride.

The first insulating layer 26 and a second insulating layer 38 may be sequentially formed on the semiconductor substrate 10 and the device isolation layer 12 in the order stated. The first insulating layer 26 may be formed of at least one of, for example, silicon oxide, silicon nitride, and silicon oxynitride. The first insulating layer 26 may be formed of silicon oxide. The first insulating layer 26 may be a complex layer including a double-layer structure having, for example, a silicon oxide layer and a silicon nitride layer, and may be a silicon oxide layer of which a surface is nitrided. The first insulating layer 26 may be formed using various methods, for example, a thermal oxidation method, a rapid thermal oxidation (RTO) method, a chemical vapor deposition (CVD) method, a plasma enhanced chemical vapor deposition (PECVD) method, a high density plasma chemical vapor deposition (HDP-CVD) method, a digital CVD method, a pulse CVD method, an atomic layer deposition method (ALD) method, or a sputtering method, but the inventive concept is not limited thereto.

The second insulating layer 38 may include at least one of silicon oxide, silicon nitride, and silicon oxynitride. The second insulating layer 38 may be formed of silicon nitride. The second insulating layer 38 may be formed so as to have the same structure as the first insulating layer 26 by using the same method of forming the first insulating layer 26. However, the second insulating layer 38 may be formed of a material having an etch selectivity with respect to the first insulating layer 26.

The device isolation layer 12, the first insulating layer 26, and the second insulating layer 38 may be formed simultaneously in the cell region and the peripheral region. The first insulating layer 26 formed in the peripheral region may be used as a gate insulating layer of a transistor, which will be described later. In addition, the second insulating layer 38 may be used as a hard mask for forming a trench, which will be described later in more detail.

Figure 5:
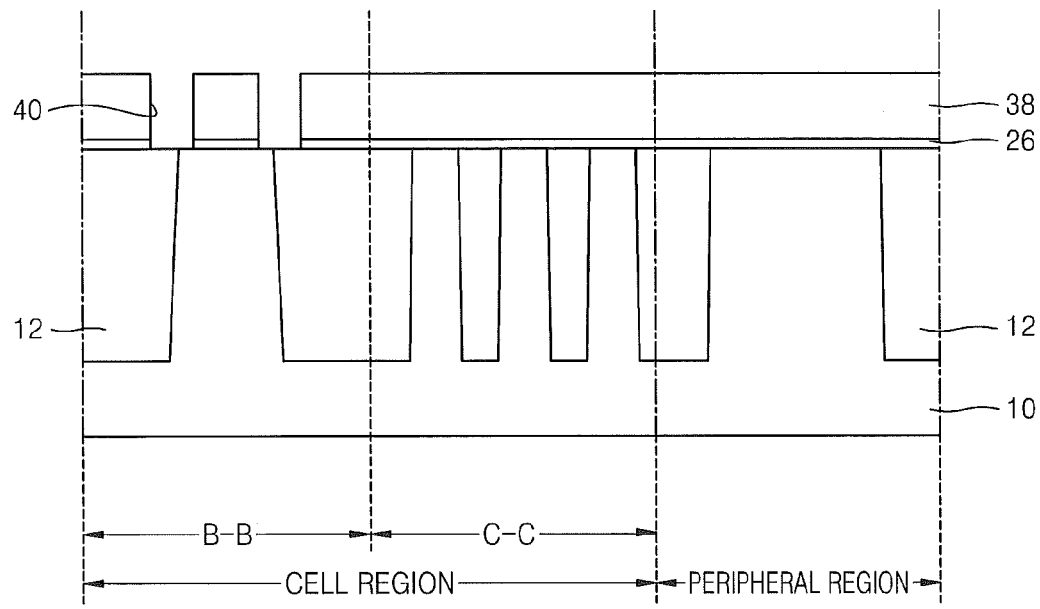

Referring to FIG. 5, openings 40 are formed in the first insulating layer 26 and the second insulating layer 38. The openings 40 may be formed in portions corresponding to portions where gate electrodes of the recess channel array transistors of FIG. 3 are formed. In order to form the openings 40, a photoresist layer (not shown) is disposed on the second insulating layer 38. Patterns corresponding to the openings 40 may be formed in the photoresist layer by using a photolithography method. The second insulating layer 38 and the first insulating layer 26 may be etched using the patterned photoresist layer as an etch mask to form the openings 40. After the openings 40 are formed, the photoresist layer is removed. If recess channel array transistors are not formed in the peripheral region, the first insulating layer 26 and the second insulating layer 38, which are formed in the peripheral region may not be patterned.

Figure 6:
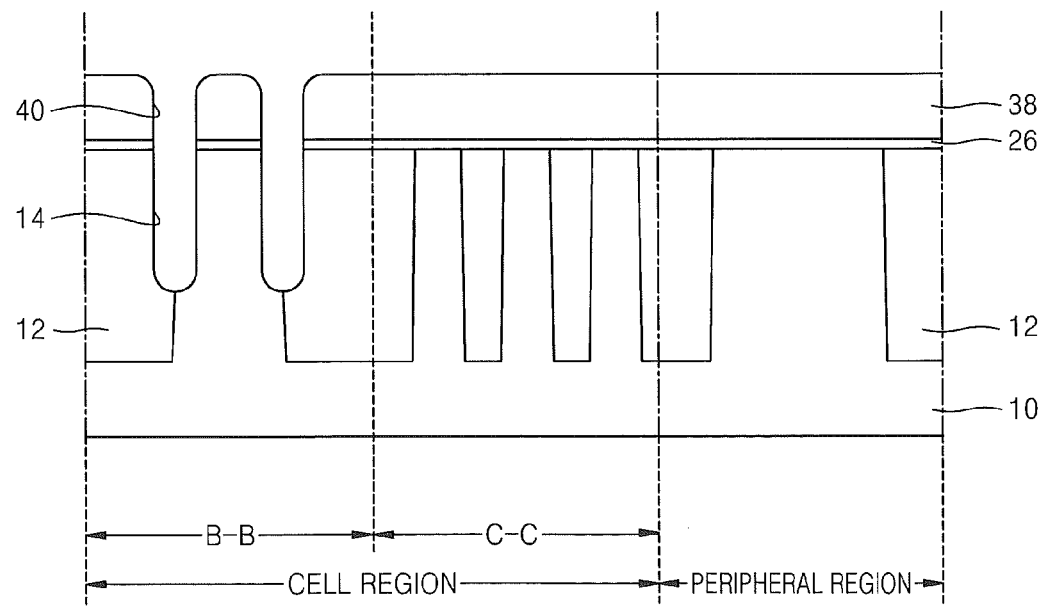

Referring to FIG. 6, trenches 14 are formed using the second insulating layer 38 that has the openings 40 formed therein as an etch mask. An etch method of forming the trenches 14 may be an anisotropic etch method such as a reactive ion etching (RIE) method, a plasma etch method, and/or an inclination etch method. A depth of each of the trenches 14 may be in the range of about 150 to about 300 nm, which is measured from an upper surface of the semiconductor substrate 10.

As shown in FIG. 6, during the formation of the trenches 14, edges of the second insulating layer 38 around the openings 40 may also be etched, and thus the edges may be rounded. In addition, lower surfaces of the trenches 14 may also be rounded, as shown in FIG. 6.

Figure 7:
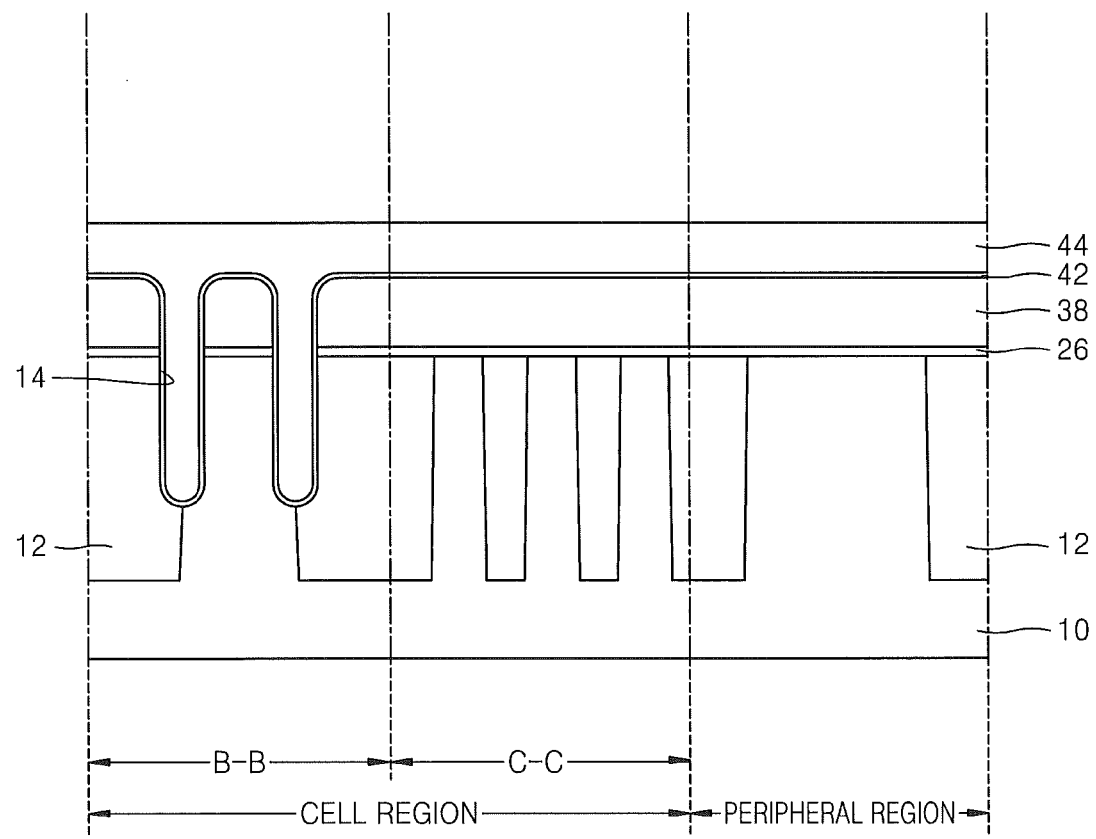

Referring to FIG. 7, a third insulating layer 42 is formed on inner walls of the trenches 14 and an upper surface of the second insulating layer 38. The third insulating layer 42 may be formed in order to function as a gate insulating layer in the cell region, and may be formed of, for example, a silicon oxide layer. The third insulating layer 42 may be formed using, for example, a CVD method, but the inventive concept is not limited thereto.

A gate conductive layer 44 may be formed on the third insulating layer 42. The gate conductive layer 44 may fill the trenches 14. The gate conductive layer 44 may be formed of, for example, metal, polysilicon, TiN, or the like. A diffusion blocking layer (not shown) may be formed directly on the third insulating layer 42 prior to forming the gate conductive layer 44. The gate conductive layer 44 may be formed using various methods, for example, a CVD method, a PECVD method, a HDP-CVD method, a sputtering method, a metal organic chemical vapor deposition (MOCVD) method, or an ALD method, but the inventive concept is not limited thereto.

Figure 8:
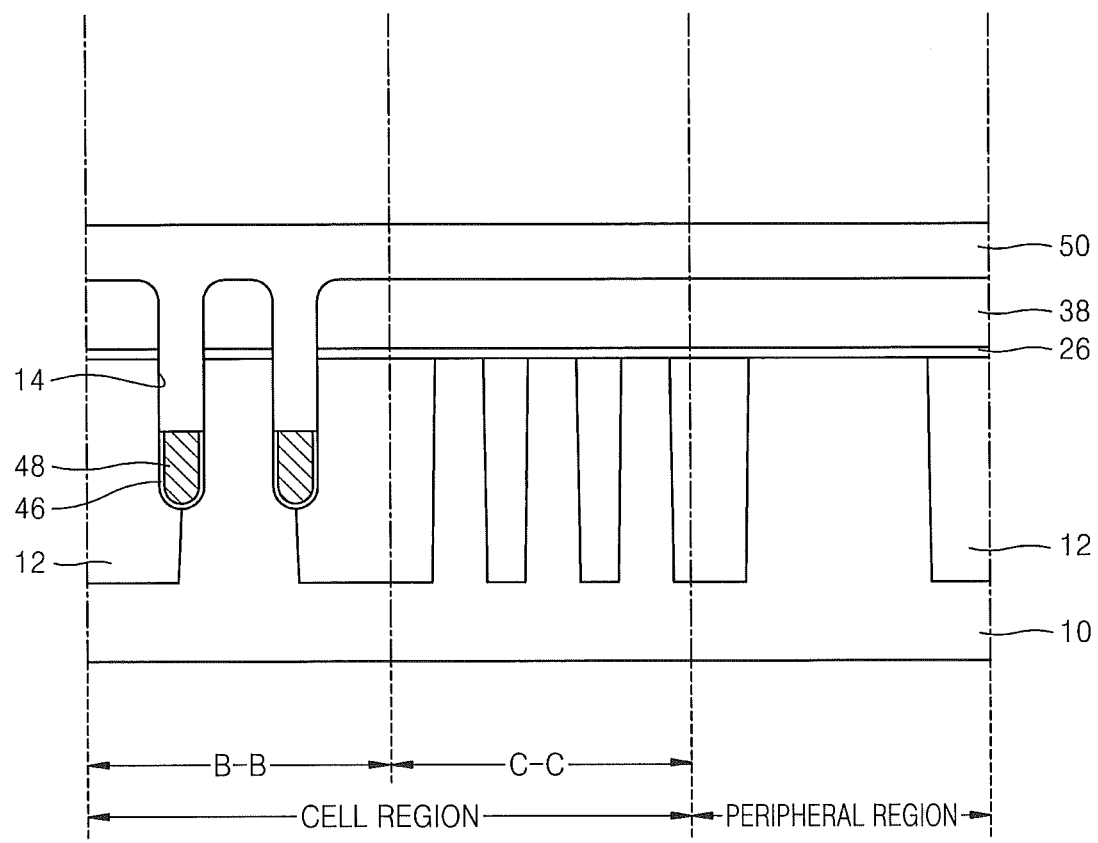

Referring to FIGS. 7 and 8, the gate conductive layer 44 fills portions of the trenches 14 to a predetermined height to form gate electrodes 48. An upper portion of the gate conductive layer 44 of FIG. 7 is removed using an anisotropic etch method in such a manner that upper surfaces of the gate electrodes 48 may be located more deeply than the upper surface of the semiconductor substrate 10. A degree of etching the gate conductive layer 44 may be determined in consideration of the depths of source and drain regions that are to be formed by injecting impurities in subsequent processes. As shown in FIG. 8, during the etching of the gate conductive layer 44, portions of the third insulating layer 42 that are positioned above the gate electrodes 48 are removed, and thus exposing upper side walls of the trenches 14.

A material layer 50 for forming capping layers 52 (see FIG. 9) may be formed on the gate electrodes 48 of the trenches 14, and the second insulating layer 38. The material layer 50 may be, for example, a silicon nitride layer, and may be formed using, for example, a CVD method, but is not particularly limited thereto. In order to prevent an excessive stress from the material layer 50 directly contacting with the semiconductor substrate 10, a buffer layer (not shown), for example, a silicon oxide layer, may be formed on the upper side walls of the trenches 14, prior to forming the material layer 50. In this case, the buffer layer may be formed using an ALD method or a thermal oxidation method.

Figure 9:
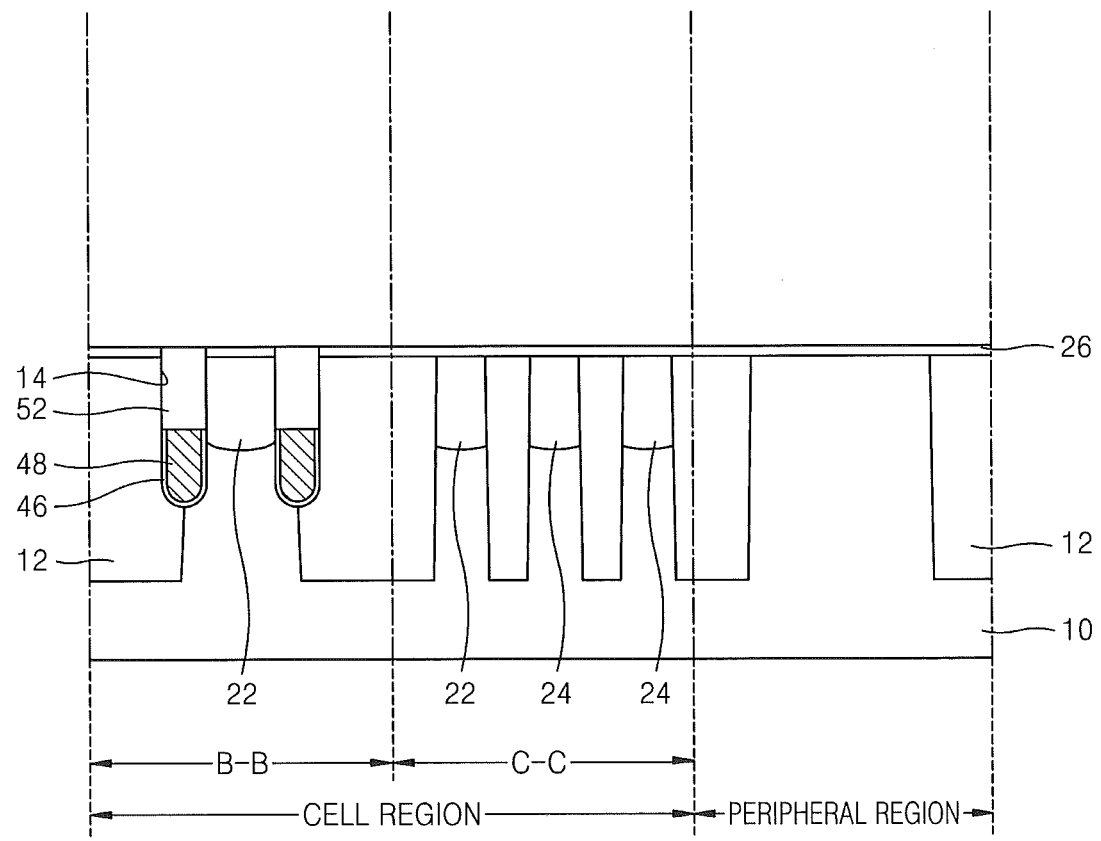

Referring to FIG. 9, the resulting structure is planarized until the first insulating layer 26 is exposed. The planarization may be performed by removing upper portions of the second insulating layer 38 and upper portions of the material layer 50, and may be performed using, for example, a chemical mechanical planarization (CMP) method in which the first insulating layer 26 is used as a planarization blocking layer. Prior to the planarization, etch-back may be performed. The capping layers 52 are formed in the trenches 14 by removing the upper portions of the material layer 50. Upper surfaces of the capping layers 52 and an upper surface of the first insulating layer 26 may be flush with each other to not have a step difference.

In the cell region, impurities may be ion-injected in order to form the drain region 22 between the trenches 14, and the source regions 24 outside of the trenches 14. The impurities may be n-type or p-type impurities. The concentration of the impurities may be controlled according to the properties of a target semiconductor device. A drain region 22, a source region 24 and a source region are formed in the respective active region Act along the line C-C of the cell region. During the ion-injection of the impurities, the peripheral region may be blocked from being doped with the impurities. Ion injection energy may be determined in such a manner that the lower surfaces of the drain and source regions 22 and 24 may be located more deeply than the upper surfaces of the gate electrodes 48 of the trenches 14.

Figure 10:
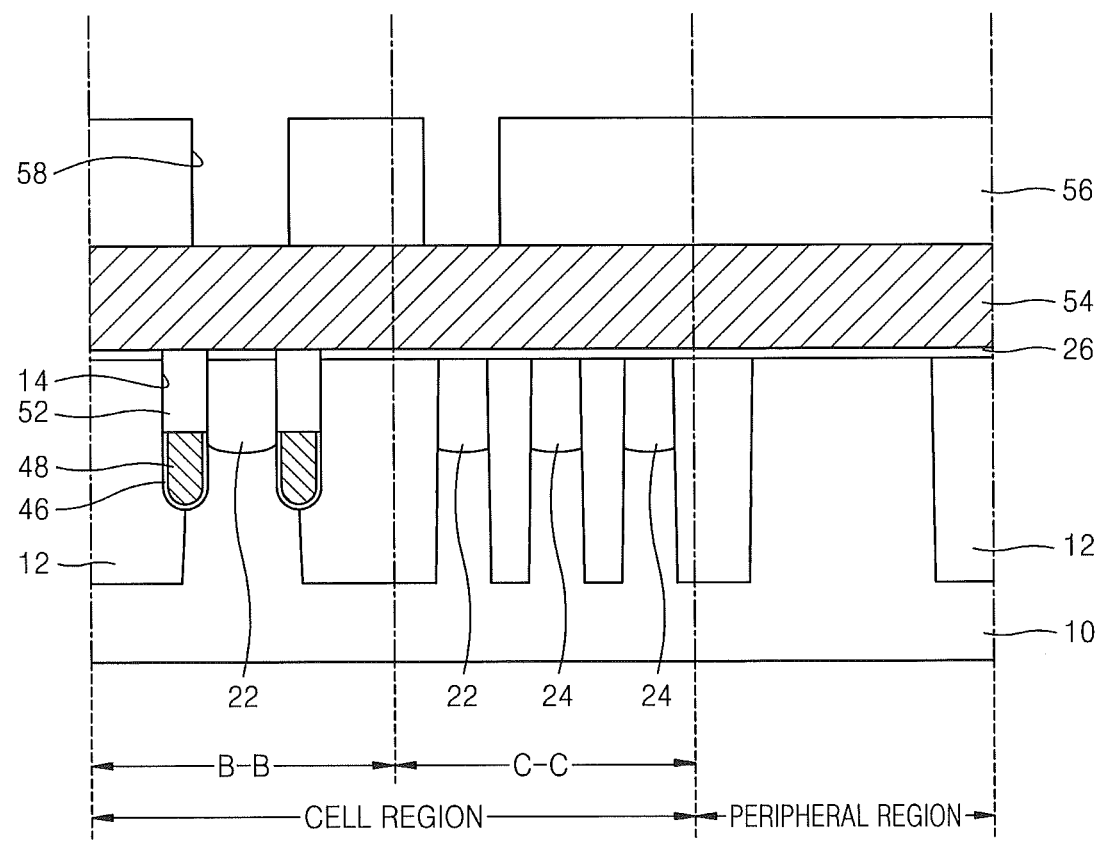

Referring to FIG. 10, a first conductive layer 54 and a fourth insulating layer 56 may be sequentially formed on the first insulating layer 26 in the order stated. The first conductive layer 54 may be formed of a conductive material, for example, polysilicon or metal. The first conductive layer 54 may be formed using a method, for example, a PVD method or a CVD method, but the inventive concept is not limited thereto. The first conductive layer 54 may be used as a bit line of the cell region and a gate electrode of the peripheral region, which will be described later. Thus, the material, doping concentration and/or doped impurities of the first conductive layer 54 may be determined according to the properties of a transistor including the gate electrode of the peripheral region. The fourth insulating layer 56 may be, for example, a silicon nitride layer, a silicon oxynitride layer, and/or a silicon oxide layer. However, the material of the fourth insulating layer 56 is not particularly limited thereto.

As shown in FIG. 10, auxiliary contact holes 58 may be formed in the fourth insulating layer 56 formed on the first conductive layer 54. The auxiliary contact holes 58 may correspond to the drain region 22. The auxiliary contact holes 58 are used to form contact holes in which bit line contact plugs BLC 28 (see FIG. 2) are formed. The auxiliary contact holes 58 may be formed using a photolithography method and an etching method, but the inventive concept is not limited thereto. A sectional view of each of the auxiliary contact holes 58 may have an appropriate shape such as a circle, an ellipse, a rectangle, or the like. As known from the bit-line contact plug BLC of FIG. 2, a sectional view of each of the auxiliary contact holes 58 may be an ellipse that is relatively long in a direction in which the bit line BL extends, but the inventive concept is not limited thereto.

Figure 11:
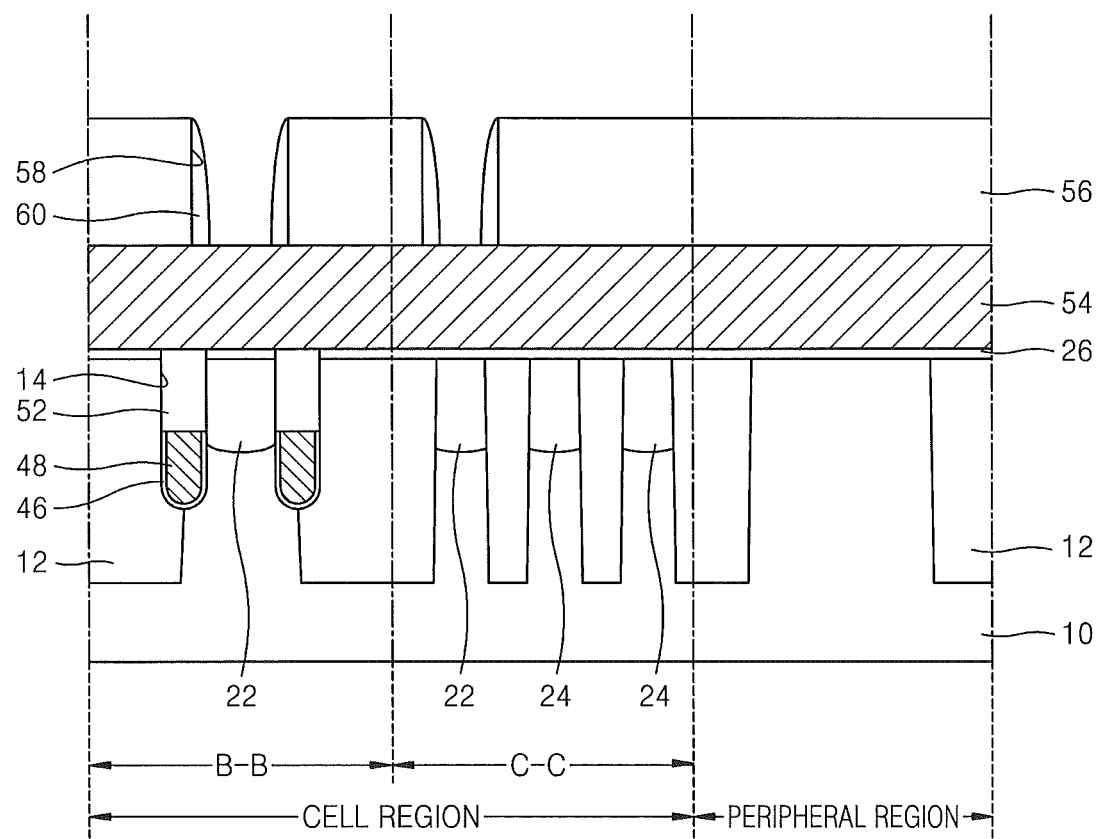

Referring to FIG. 11, spacers 60 are formed on inner walls of the auxiliary contact holes 58. The spacers 60 may be formed of, for example, silicon nitride. In addition, the spacers 60 may be formed by forming a material layer (not shown) for forming the spacers 60 and then performing an anisotropic etch method. By forming the spacers 60 on the inner walls of the auxiliary contact holes 58, an internal diameter or size of each of the spacers 60 may be smaller than an internal diameter or size of each of the auxiliary contact holes 58.

Figure 12:
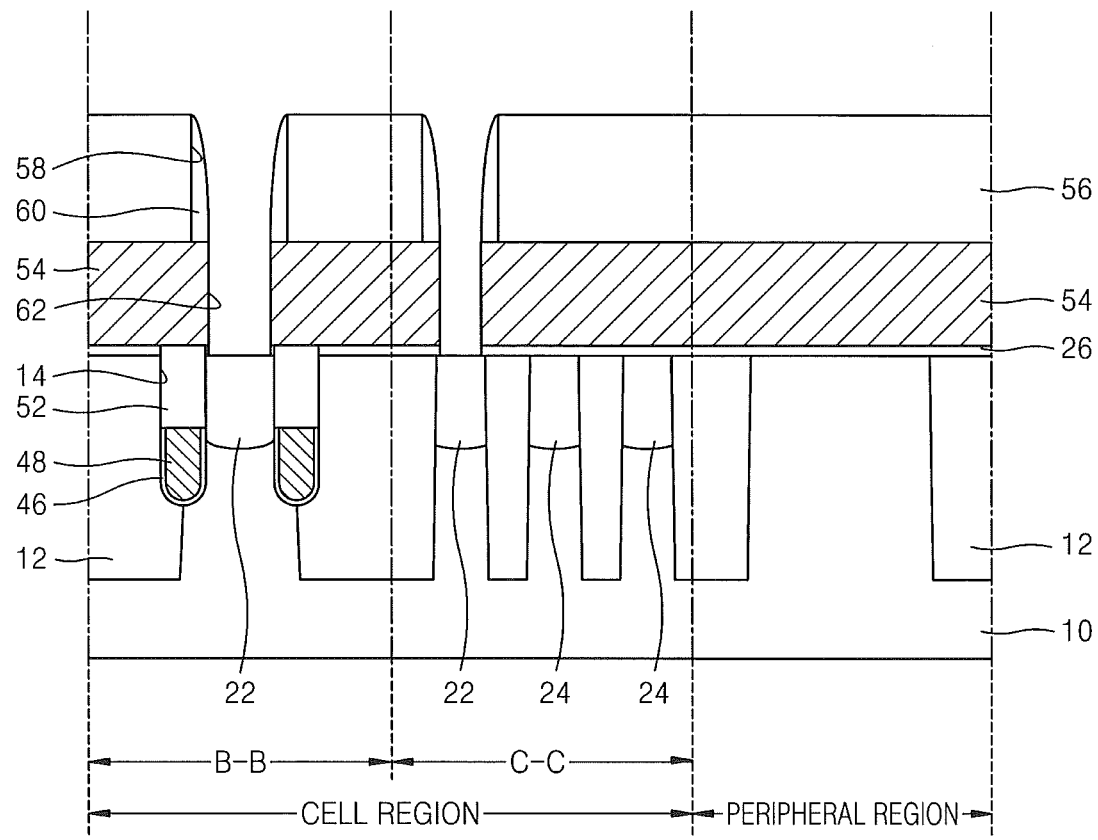

Referring to FIG. 12, contact holes 62 may be formed in the first conductive layer 54 and the first insulating layer 26 by using the spacers 60 and the fourth insulating layer 56 as an etch mask, and the semiconductor substrate 10 as an etch stop layer. At least a portion of the drain region 22 of the semiconductor substrate 10 may be exposed through the contact holes 62. As shown in FIG. 12, only the portion of the drain region 22 is exposed through the contact holes 62. However, the contact hole 62 may be formed to have a greater size than that of the drain region 22, or may be offset from the drain region 22 due to misalignments and/or size errors that may be unavoidable during fabricating processes.

Since the device isolation layer 12 or the capping layer 52 is formed to be adjacent to the drain region 22, errors such as short circuits may not occur. The first conductive layer 54 and the first insulating layer 26 may be etched using an anisotropic dry etch or wet etch method, but the inventive concept is not limited thereto. The contact holes 62 may each have a smaller diameter or size than that of the auxiliary contact hole 58, and may be coaxially arranged with the auxiliary contact holes 58. Since the contact holes 62 are formed using the spacers 60, the contact holes 62 may be formed to have a small size that surpasses a size limit of a photolithography process. In the present embodiment, due to the size limit of the photolithography process, the contact holes 62 are formed using the fourth insulating layer 56 and the spacers 60. Alternatively, in a case where the size limit is further reduced, or problems do not occur even if the contact holes 62 are formed to have a sufficiently large size, the operations described with reference to FIGS. 10 and 11 may be omitted, and the first conductive layer 54 and the first insulating layer 26 may be patterned directly using a photolithography process.

Figure 13:
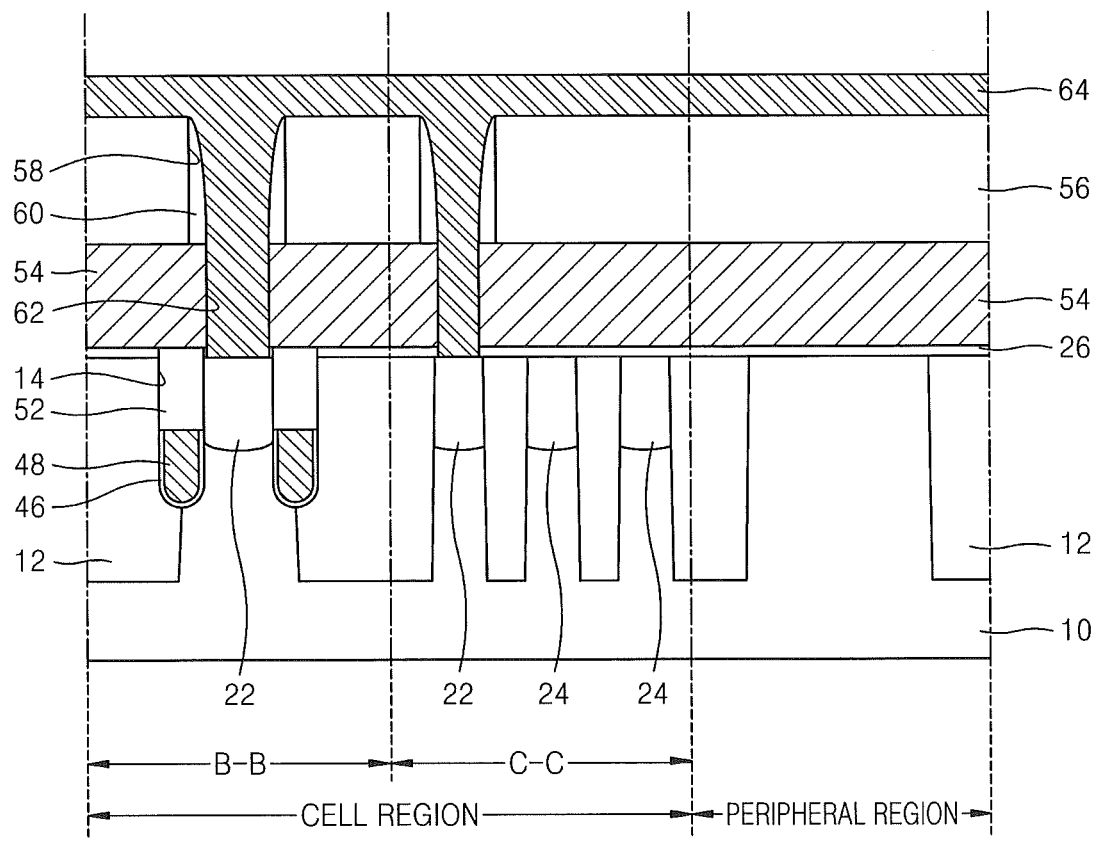

Referring to FIG. 13, a second conductive layer 64 is formed on the fourth insulating layer 56 to fill the contact holes 62. The second conductive layer 64 may include impurities for reducing a resistance with the drain region 22. The second conductive layer 64 may be formed of a conductive material, for example, metal or polysilicon. The second conductive layer 64 may be formed of the same material as that of the first conductive layer 54, or may be formed of a different material from that of the first conductive layer 54. For example, when the first conductive layer 54 is formed of doped polysilicon, the second conductive layer 64 may be formed of metal, or doped polysilicon with a different doping concentration or different impurities. The second conductive layer 64 may be formed of an appropriate material for reducing a resistance with the drain region 22. In this case, the properties of the gate electrode of the peripheral region do not have to be considered.

Figure 14:
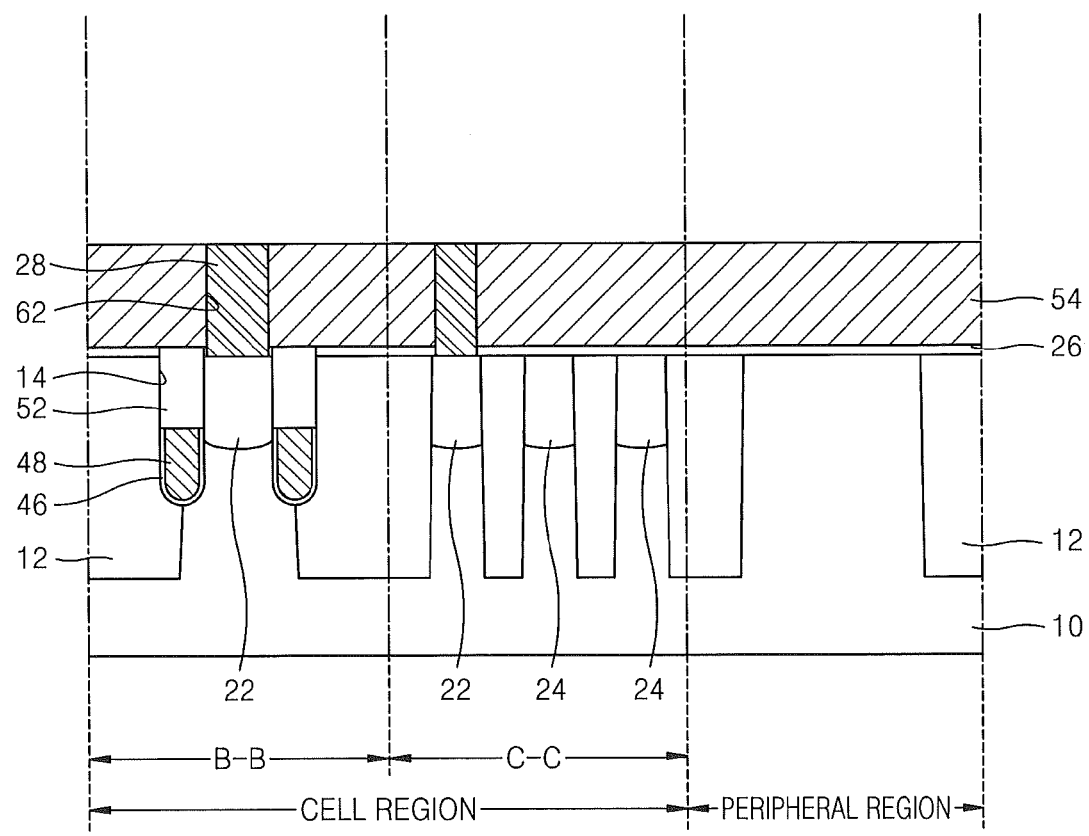

Referring to FIG. 14, the resulting structure is planarized until the first conductive layer 54 is exposed. The planarization may be performed by removing an upper portion of the second conductive layer 64, the fourth insulating layer 56, and the spacers 60, and may be performed using, for example, a CMP method. Alternatively, etch-back may be used in order to remove the upper portion of the second conductive layer 64, and then the fourth insulating layer 56 and the spacers 60 are removed using a wet etch method. As shown in FIG. 14, as a result of the planarization, the contact plugs 28 may be formed by removing the upper portion of the second conductive layer 64. Upper surfaces of the contact plugs 28 and an upper surface of the first conductive layer 54 may be flush with each other. That is, upper surfaces of the contact plugs 28 and the bit lines 30 may be flush with each other, as will be described later.

Figure 15:
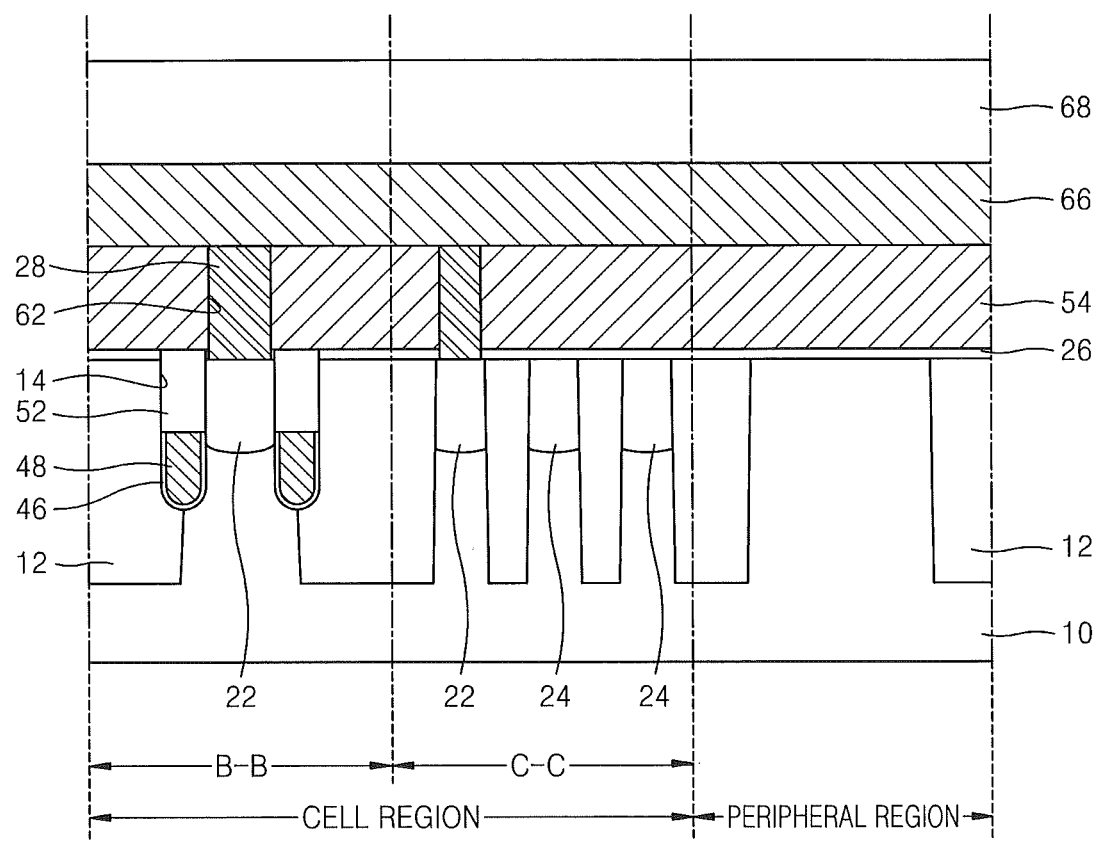

Referring to FIG. 15, a third conductive layer 66 may be formed on the contact plugs 28 and the first conductive layer 54. The third conductive layer 66 may be formed of a different material of that of each of the contact plugs 28 and the first conductive layer 54. The third conductive layer 66 may be provided in order to reduce a resistance of the bit lines 30, and may be omitted. Prior to forming the third conductive layer 66, in order to reduce a contact resistance between the first conductive layer 54 and the third conductive layer 66, a material layer (not shown), for example, a metal silicide layer may be formed. A material layer 68 for forming hard mask patterns 70 (see FIG. 16) may be formed on the third conductive layer 66.

Figure 16:
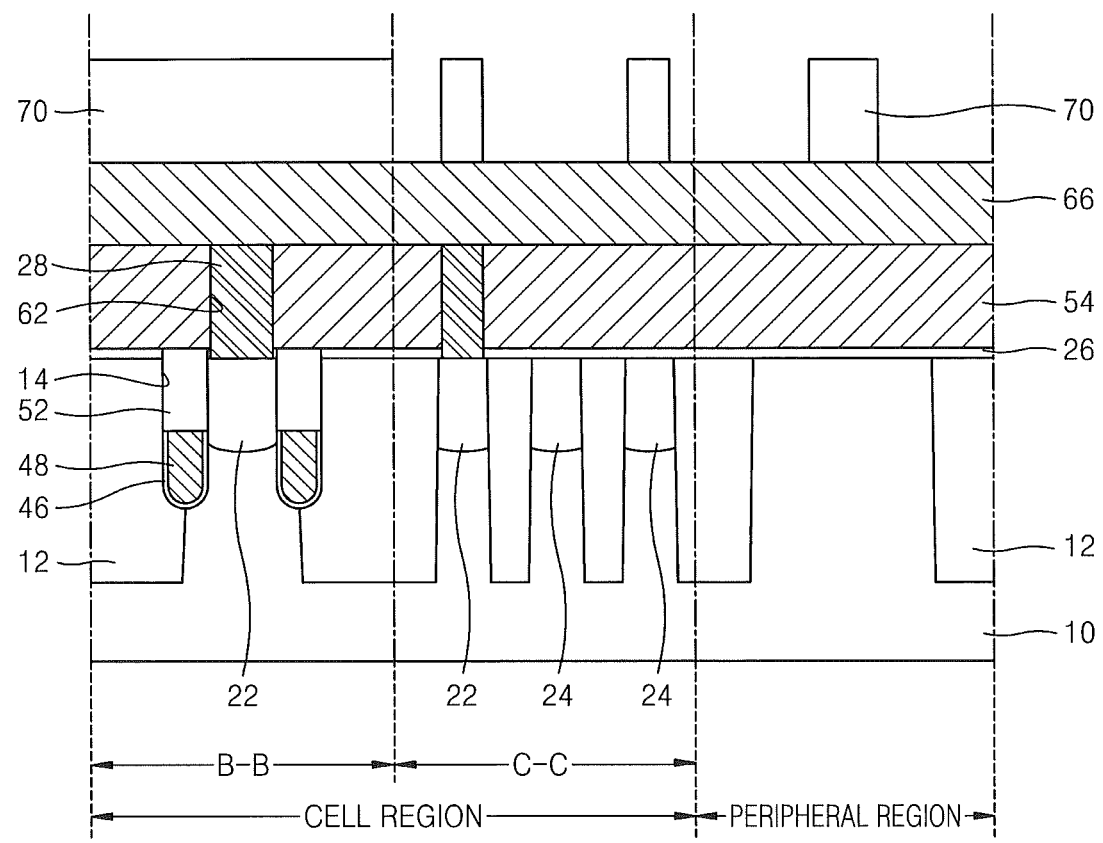

Referring to FIG. 16, the material layer 68 is patterned to form the hard mask patterns 70. The hard mask patterns 70 correspond to the bit lines of the cell region, and the gate electrodes of the peripheral region. The hard mask patterns 70 may be patterned using, for example, a photolithography method or an etching method.

Figure 17:
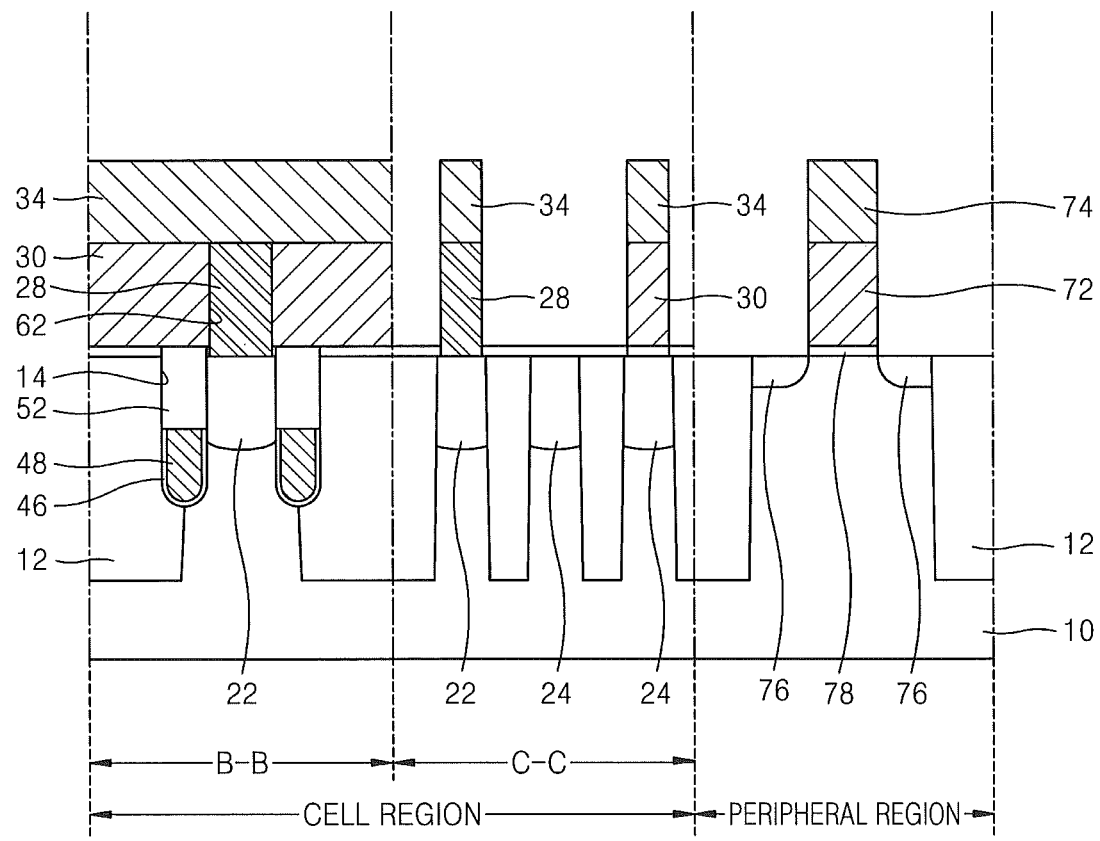

Referring to FIG. 17, the third conductive layer 66 and the first conductive layer 54 may be patterned using the hard mask patterns 70 as an etch mask, and thus bit lines 30 are formed in the cell region, and gate electrodes 72 are formed in the peripheral region 102. Upper bit lines 34 may be formed on the bit lines 30 and the contact plugs 28, in the cell region. Upper gate electrodes 74 may be formed on the gate electrodes 72, in the peripheral region.

As explained above, the bit lines 30 and the gate electrodes 72 may be formed simultaneously by patterning the third conductive layer 66 and the first conductive layer 54. In addition, the bit lines 30 and the gate electrodes 72 are formed of the same material, and the upper bit lines 34 and the upper gate electrodes 74 are formed of the same material. However, since the contact plugs 28 are formed from the second conductive layer 64, the contact plug 28 is formed of a different material from that of each of the gate electrodes 72 and the bit lines 30. Thus, since a material for forming the contact plugs 28 may be widely selected according to desired properties, the performance of a semiconductor device may be improved. In the peripheral region, a gate insulating layer 78 may be formed below the gate electrodes 72 by patterning the first insulating layer 26 by using the gate electrodes 72 as an etch mask. In addition, impurity regions 76 may be formed by ion-injecting impurities into both sides of the gate electrodes 72 by using the gate electrodes 72 as an ion injection mask. The gate electrodes 72 and the impurity regions 76 may constitute a transistor in the peripheral region, and the transistor may be used in the peripheral region.

Referring back to FIG. 3, although not illustrated in FIG. 17, the storage node contacts 32 may be formed on the source regions 24. In order to form the storage node contacts 32, contact holes corresponding to the source regions 24 may be formed in the first insulating layer 26. In addition, the storage regions 36, for example, capacitors may be formed on the storage node contacts 32. The storage node contacts 32 may electrically connect the source regions 24 and the storage regions 36 to each other.

Two transistors that share a drain region in a single active region may be formed using the above-described method. The transistors may each be a recess channel array transistor including a gate electrode that partially fills each trench. In addition, a DRAM memory cell in which a drain region is connected to a bit line and source regions are each connected to storage regions may be formed.

The inventive concept has been described with respect to DRAM memory cells, but it will be understood that various changes in form and details may be made. For example, it will be understood that some operations of the above-described operations may be omitted.

While the inventive concept has been particularly shown and described with reference to exemplary embodiments thereof, it will be understood that various changes in form and details may be made therein without departing from the spirit and scope of the following claims.

What is claimed is:

1. A semiconductor device comprising:
    a transistor disposed in a semiconductor substrate, the transistor comprising a gate electrode extending in a first direction, a gate insulating layer disposed on the gate electrode, and a source region and a drain region respectively disposed adjacent the gate electrode;
    a contact plug contacting the drain region;
    a first conductive layer extending in a second direction disposed on the substrate; and
    a second conductive layer disposed on the first conductive layer, the second conductive layer electrically connected to the drain region through the contact plug,
    wherein the contact plug has a first side surface contacting the first conductive layer extending in the second direction and,
    the contact plug has a second side surface that does not contact the first conductive layer extending in the second direction.

2. The semiconductor device of claim 1, further comprising a storage region contacting the source region through a storage node contact.

3. The semiconductor device of claim 1, wherein the transistor is disposed in a cell region of a DRAM device.

4. The semiconductor device of claim 3, further comprising another transistor disposed in a peripheral region of the DRAM device, wherein a first gate electrode and a second gate electrode of the another transistor are formed from the same layers used to form the first conductive layer and the second conductive layer, respectively.

5. The semiconductor device of claim 1, wherein the contact plug has a substantially oval-shape cross section.

6. The semiconductor device of claim 1, further comprising a first insulating layer disposed on the substrate, wherein the contact plug contacts the drain region through the first insulating layer.

7. The semiconductor device of claim 6, further comprising a capping layer disposed on the gate electrode.

8. The semiconductor device of claim 7, wherein the capping layer contacts the first insulating layer.

9. The semiconductor device of claim 1, wherein the top most surface of the gate electrode is disposed under the top most surface of the semiconductor substrate.

10. The semiconductor device of claim 1, wherein the contact plug and the first conductive layer has a substantially same height.

11. A semiconductor device comprising:
- a transistor disposed in a semiconductor substrate, the transistor comprising a gate electrode extending in a first direction, a gate insulating layer disposed on the gate electrode, and a source region and a drain region respectively disposed adjacent the gate electrode;
- a contact plug contacting the drain region;
- a first conductive layer extending in a second direction disposed on the substrate; and
- a second conductive layer disposed on the first conductive layer, the second conductive layer being in contact with the contact plug,
- wherein the contact plug has a first surface contacting the first conductive layer extending in the second direction and,
- the contact plug has a second surface that does not contact the first conductive layer extending in the second direction.

* * * * *